United States Patent
Lin

(10) Patent No.: US 8,023,667 B2
(45) Date of Patent: Sep. 20, 2011

(54) MICRO-ELECTRO-MECHANICAL SYSTEMS (MEMS) CAPACITIVE SENSING CIRCUIT

(75) Inventor: Yuh-Min Lin, San Ramon, CA (US)

(73) Assignee: Analogtek Corp., Hsinchu (TW)

( * ) Notice: Subject to any disclaimer, the term of this patent is extended or adjusted under 35 U.S.C. 154(b) by 919 days.

(21) Appl. No.: 12/014,697

(22) Filed: Jan. 15, 2008

(65) Prior Publication Data
US 2009/0161890 A1    Jun. 25, 2009

(30) Foreign Application Priority Data
Dec. 25, 2007  (TW) ................ 96149913 A

(51) Int. Cl.
*H04R 3/00*  (2006.01)
(52) U.S. Cl. ....................... 381/113; 381/111
(58) Field of Classification Search .......... 381/111, 381/113
See application file for complete search history.

(56) References Cited

U.S. PATENT DOCUMENTS

| 7,756,279 B2* | 7/2010 | Deruginsky et al. | 381/95 |
| 2008/0089536 A1* | 4/2008 | Josefsson | 381/113 |
| 2009/0110213 A1* | 4/2009 | Holzmann | 381/95 |

* cited by examiner

*Primary Examiner* — Luan C Thai
(74) *Attorney, Agent, or Firm* — Ming Chow; Sinorica, LLC

(57) ABSTRACT

The present invention discloses a Micro-Electro-Mechanical Systems (MEMS) capacitive sensing circuit wherein two input nodes of a fully differential amplifier are separately connected to a MEMS capacitive sensing device and a matching capacitor, which both contain similar capacity value and connect to a bias node, and two resistors separately connect the MEMS capacitive sensing device and the matching capacitor to ground (zero voltage). Thus, the present invention could effectively eliminate the bias noise in the circuit without any discrete capacitor and capable for designer to integrate all circuit devices into an IC.

11 Claims, 3 Drawing Sheets

( Piror art )

MICRO-ELECTRO-MECHANICAL SYSTEMS (MEMS) CAPACITIVE SENSING CIRCUIT

BACKGROUND OF THE INVENTION

1. Field of the Invention

The present invention relates to a MEMS (Micro-Electro-Mechanical Systems) capacitive sensing circuit, and more particularly, to a MEMS capacitive sensing circuit for eliminating the bias noise.

2. Description of the Related Art

The capacitive sensing device (e.g. microphone) is well known in the art and commonly used in medical equipments or communication industry. Along with the vigorous development of electrical industry and the considerable progress of manufacturing process, the microphone product is required for thinner, smaller, lighter, less power and low cost. Hence, the microphone, which can be integrated within the semiconductor manufacturing chip, is an important trend for current development.

For instance, in U.S. Pat. No. 5,577,129, a conventional ECM (electret condenser microphone) amplifier circuit is utilized to eliminate the noise generated by a bias circuit of ECM. As shown in FIG. 1, the sound wave movement causes the difference of capacity value in an ECM microphone 10, which generates a signal into the input negative node of an amplifier 12. Then the amplifier 12 amplifies and outputs the signal. Meanwhile the noise from a bias circuit 14 will enter into the input positive node and negative node of the amplifier 12 simultaneously and part of noise will be eliminated based on the common mode rejection ratio (CMRR) characteristic in the amplifier 12. However, the conventional ECM amplifier circuit requires discrete capacitors 16 and 18, and the required capacity values are between 0.1 to 10 µF, which might be too huge to design into an integrated circuit.

Additionally, the conventional MEMS microphone amplifier circuit requires a bias circuit for providing a bias voltage to MEMS microphone and the bias noise must far less than the minimum signal (several uV) outputted from the microphone. Generally, a discrete capacitor is required for stabilizing the voltage level and eliminating the noise. However, it is still a problem for designer to integrate the discrete capacitor into an integrated circuit.

Therefore, to solve the above-mentioned problems, the present invention proposes a MEMS capacitive sensing circuit for eliminating the bias noise.

SUMMARY OF THE INVENTION

The primary objective of the present invention is to provide a MEMS capacitive sensing circuit, which could effectively eliminate the bias noise in the circuit without any discrete capacitor.

It is another of the objectives of the present invention to provide a MEMS capacitive sensing circuit capable to integrate all devices into an IC and achieve the less usage area and smaller requirement.

According to an aspect of the present invention, a MEMS capacitive sensing circuit is disclosed. The MEMS capacitive sensing circuit is utilized for amplifying and outputting a received detecting signal, and comprises: an amplifier with a first input node and a second input node for amplifying and outputting the detecting signal, wherein the first input node and the second input node have different polarity; at least a MEMS capacitive sensing device, coupled to a bias node and the first input node, for generating the detecting signal to the amplifier; at least a matching capacitor, coupled to the bias node and the second input node, wherein the capacity value of the matching capacitor is matching to the capacity value of the MEMS capacitive sensing device; a first resistance, coupled to the MEMS capacitive sensing device and the amplifier, for biasing the MEMS capacitive sensing device to a ground node; and a second resistance, coupled to the matching capacitor and the amplifier, for biasing the matching capacitor to the ground node. The MEMS capacitive sensing circuit could eliminate the bias noise by the common mode rejection ratio (CMRR) characteristic of the amplifier and the matching value of the matching capacitor and the MEMS capacitive sensing device.

Below, the embodiments of the present invention are described in detail in cooperation with the attached drawings to make easily understood the objectives, technical contents, characteristics and accomplishments of the present invention.

DETAILED DESCRIPTION OF THE INVENTION

The present invention includes a fully differential circuit formed by the positive voltage node and the negative voltage node of the amplifier, and further includes a matching capacitor, which could be integrated into an integrated circuit. Please note that, the capacity value of the matching capacitor is similar or equal to any MEMS capacitive sensor. Thus, the present invention could effectively eliminate the bias noise in the circuit without any discrete capacitor. The following detail description is based on a MEMS microphone, one common application of the capacitive sensing devices, as an embodiment, and the received sound signal is perceived as a detecting signal.

Figure 1:
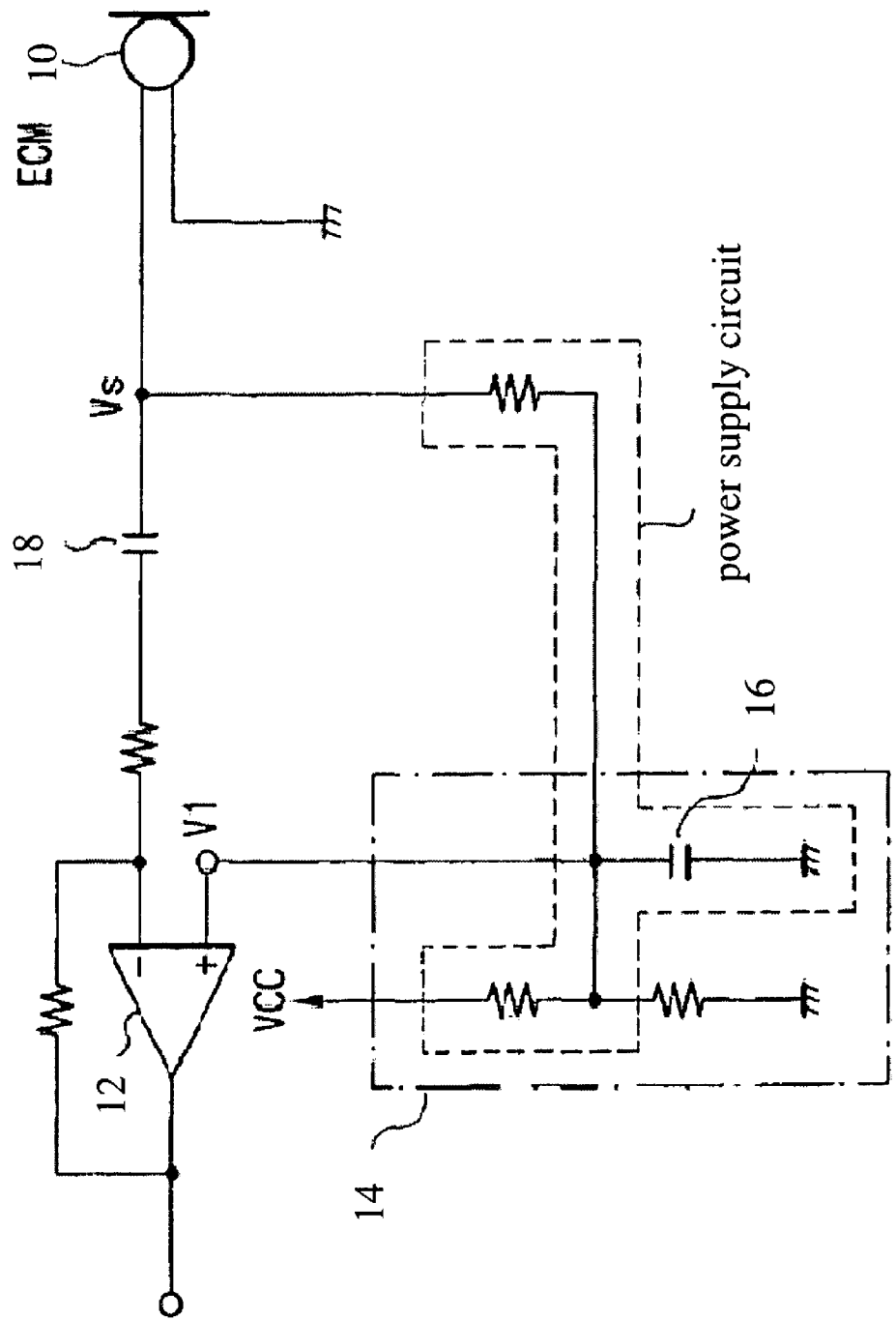
FIG. 1 is a diagram schematically showing a circuit of a conventional ECM amplifier circuit.
Figure 2:
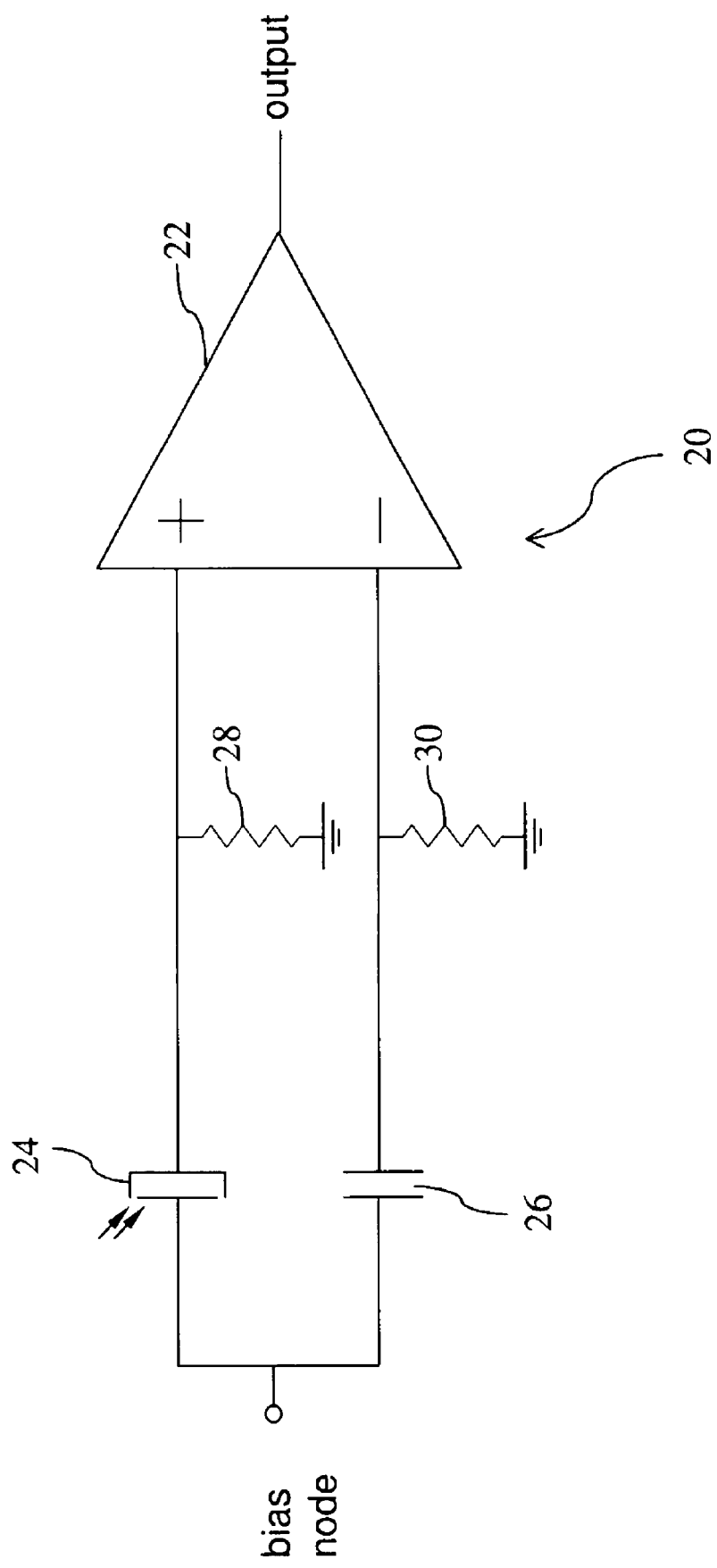
FIG. 2 is a schematic diagram according to an embodiment of the present invention.

Please refer to FIG. 2. FIG. 2 is a schematic diagram according to an embodiment of the present invention. As shown in FIG. 2, the MEMS microphone circuit 20 is utilized to amplify and output the detected sound signal. The MEMS microphone circuit 20 includes a fully differential operational amplifier 22, which contains different polarity of a first input node and a second input node, with respect to the positive voltage node and the negative voltage node. The amplifier 22 is utilized to amplify and output the sound signal. One node of a MEMS microphone 24 is connected to a bias node; and the other node of the MEMS microphone 24 is connected to the positive voltage node of the amplifier 22. The MEMS microphone 24 is utilized to receive the surrounding sound and generate the corresponding sound signal into the amplifier 22. The negative voltage node of the amplifier 22 is connected to a matching capacitor 26, and the other node of the matching capacitor 26 is connected to the bias note. Please note that, the capacity value of the matching capacitor 26 is matching to the inner capacity value of the MEMS microphone 24, which could be measured in advance. The MEMS microphone circuit 20 further includes a first resistance 28, which is connected to the MEMS microphone 24 and the amplifier 22 for biasing the MEMS microphone 24 to ground; and a second resistance 30, which is connected to the matching capacitor 26 and the amplifier 22 for biasing the matching capacitor 26 to ground (zero voltage).

Additionally, the above-mentioned matching capacitor 26 could be manufactured by the present semiconductor technology (e.g. CMOS manufacturing process). The matching capacitor 26 could be a metallized film capacitor, a stack capacitor, or a poly-poly capacitor. Moreover, the matching capacitor 26, the MEMS microphone 24, the first resistance 28, and the second resistance 30 could be integrated into a signal chip based on the present semiconductor technology.

Figure 3:
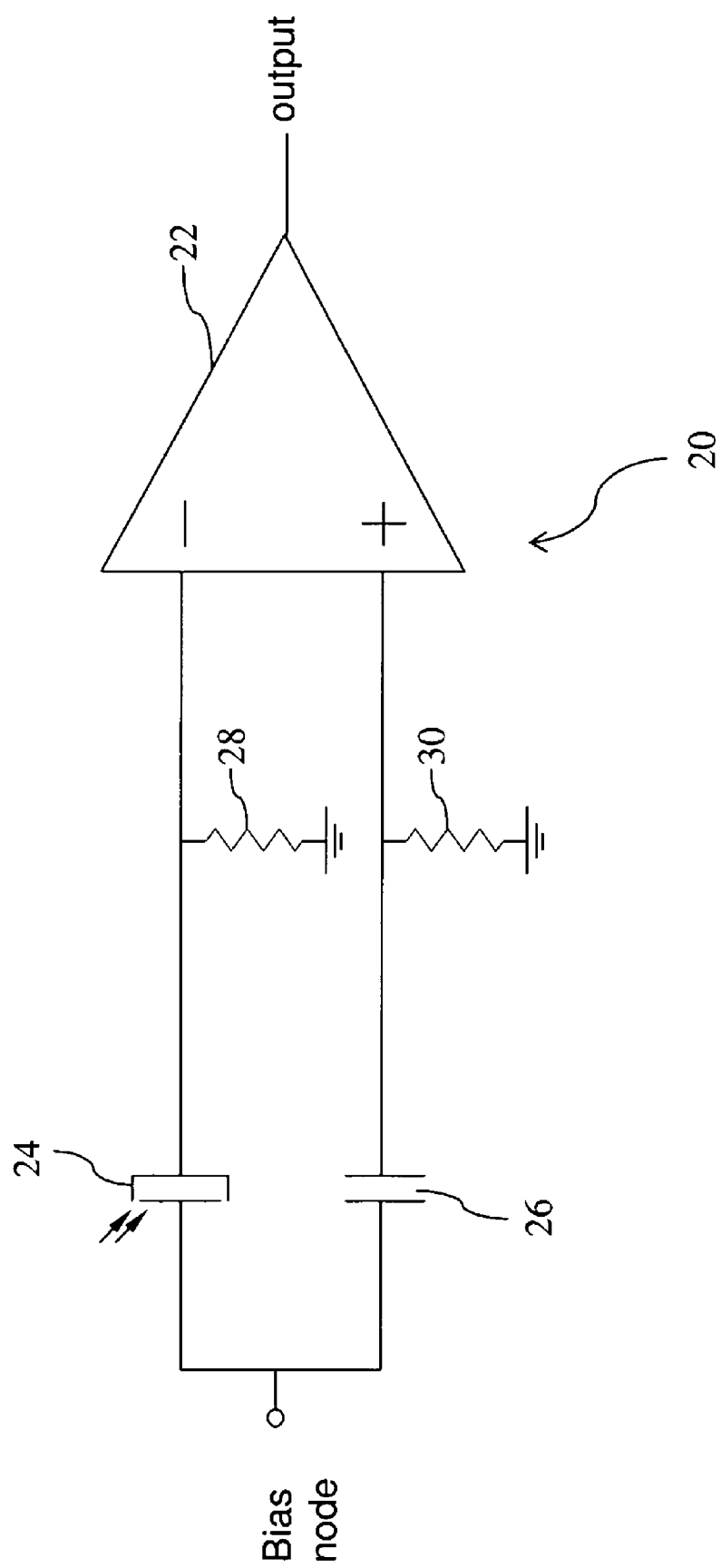
FIG. 3 is a schematic diagram according to another embodiment of the present invention.

Please note that, in the above-mentioned embodiment, the first input node is perceived as the positive voltage node connected to the MEMS microphone 24, and the second input node is perceived as the negative voltage node connected to the matching capacitor 26. However, in the present invention, the first input node could be also perceived as the negative voltage node, and the second input node could be perceived as the positive voltage node. As shown in FIG. 3, the MEMS microphone 24 is connected to the negative voltage node of the amplifier 22, and the matching capacitor 22 is connected to the positive voltage node of the amplifier 22. Since the elements in the first and second embodiment have the same function and operation, detailed description is omitted for the sake of brevity.

Please further refer to FIG. 2, in the common practice, the inner capacity value of the MEMS microphone is between 0.1~10 pF, and the capacity value of the matching capacitor could be selected to the similar value. The working bias provided by the bias node is between 2~9 voltages. The resistance value (e.g. 1~100 GΩ) of the first and second resistances could be determined according to different capacity value and voltage. The surrounding sound movement causes the difference of capacity value in the MEMS microphone 24, which generates a sound signal (electric charge) into the positive voltage node of the amplifier 22 (or the negative voltage node in FIG. 3). Because the capacity value of the matching capacitor remains the same, no additional signal is generated, and therefore the amplifier 22 amplifies the sound signal of the MEMS microphone 24 and sends it to the output node.

Meanwhile, the noise generated from the bias node would pass through the MEMS microphone 24 and the matching capacitor 26 simultaneously. The noise could be eliminated by the common mode rejection ratio (CMRR) characteristic in the amplifier 22. Moreover, because the MEMS microphone 24 and the matching capacitor 26 can be manufactured into the same IC, the capacity value of both two could be extremely close, which means better noise eliminating performance.

For example, assume that the capacity value of the MEMS microphone is 1 pF, and the capacity value of the matching capacitor is 0.99 pF. The different between the above two is around 1%. If the CMRR value of the amplifier is 80 dB, the input noise from the amplifier would be equal to 1% bias noise, which indicates that the noise eliminating performance is outstanding.

Additionally, the above-mentioned embodiments are utilized for illustrating the technical concept of the present invention. Furthermore, the circuit described in the present invention can also be used in any capacitive sensor, which uses the capacitive sensor device as the signal source.

As mentioned above, the present invention could effectively eliminate the bias noise in the circuit without any discrete capacitor and capable for designer to integrate the MEMS microphone, the matching capacitor, and the resistances into an IC and achieve the less usage area and smaller requirement.

Those described above are only the preferred embodiments to exemplify the present invention but not to limit the scope of the present invention. Any equivalent modification or variation according to the shapes, structures, features and spirit disclosed in the specification is to be also included within the scope of the present invention.

What is claimed is:

1. A Micro-Electro-Mechanical Systems (MEMS) capacitive sensing circuit for amplifying and outputting a received detecting signal, comprising:
    an amplifier with a first input node and a second input node for amplifying and outputting said detecting signal, wherein said first input node and said second input node have different polarity;
    at least a MEMS capacitive sensing device, coupled to a bias node and said first input node, for generating said detecting signal to said amplifier;
    at least a matching capacitor, coupled to said bias node and said second input node, wherein a capacity value of said matching capacitor is matching to an inner capacity value of said MEMS capacitive sensing device;
    a first resistance, coupled to said MEMS capacitive sensing device and said amplifier, for biasing said MEMS capacitive sensing device to a ground node; and
    a second resistance, coupled to said matching capacitor and said amplifier, for biasing said matching capacitor to said ground node.

2. The MEMS capacitive sensing circuit of claim 1, wherein said first input node is a positive voltage node, and said second input node is a negative voltage node.

3. The MEMS capacitive sensing circuit of claim 1, wherein said first input node is a negative voltage node, and said second input node is a positive voltage node.

4. The MEMS capacitive sensing circuit of claim 1, wherein said amplifier is a fully differential amplifier.

5. The MEMS capacitive sensing circuit of claim 1, wherein said MEMS capacitive sensing device, said matching capacitor, said first resistance, and said second resistance are capable to integrate in a IC based on a semiconductor manufacturing technology.

6. The MEMS capacitive sensing circuit of claim 1, wherein said matching capacitor is a metallized film capacitor, a stack capacitor, or a poly-capacitor.

7. The MEMS capacitive sensing circuit of claim 6, wherein said matching capacitor is manufactured by CMOS process.

8. The MEMS capacitive sensing circuit of claim 1, wherein said capacity value or said inner capacity value is between 0.1~10 pF.

9. The MEMS capacitive sensing circuit of claim 1, wherein a bias provided by said bias node is between 2~9 voltages.

10. The MEMS capacitive sensing circuit of claim 1, wherein a resistance value of said first resistance and said second resistance is between 1~100 GΩ.

11. The MEMS capacitive sensing circuit of claim 1, wherein said MEMS capacitive sensing device is a MEMS microphone.

* * * * *